(12) United States Patent
Sakamoto et al.

(10) Patent No.: US 8,107,255 B2
(45) Date of Patent: *Jan. 31, 2012

(54) CIRCUIT DEVICE AND METHOD OF MANUFACTURING THE SAME

(75) Inventors: Hideyuki Sakamoto, Gunma (JP); Hidefumi Saito, Gunma (JP); Yasuhiro Koike, Gunma (JP); Masao Tsukizawa, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/239,256

(22) Filed: Sep. 26, 2008

(65) Prior Publication Data
US 2009/0103276 A1    Apr. 23, 2009

(30) Foreign Application Priority Data

Sep. 27, 2007  (JP) .................................. 2007-250486

(51) Int. Cl.
*H05K 1/11* (2006.01)
*H05K 1/14* (2006.01)
(52) U.S. Cl. ......... 361/792; 361/695; 361/707; 361/803
(58) Field of Classification Search .................. 361/792, 361/707, 803, 695
See application file for complete search history.

(56) References Cited

U.S. PATENT DOCUMENTS

| | | | |
|---|---|---|---|
| 4,901,203 A | 2/1990 | Kobayashi et al. | |
| 5,105,322 A | 4/1992 | Steltzer | |
| 5,408,383 A | 4/1995 | Nagasaka et al. | |
| 5,444,297 A | 8/1995 | Oshima et al. | |
| 5,519,252 A | 5/1996 | Soyano et al. | |
| 5,586,388 A | 12/1996 | Hirao et al. | |
| 5,610,799 A | 3/1997 | Kato | |
| 5,646,827 A | 7/1997 | Hirao et al. | |

(Continued)

FOREIGN PATENT DOCUMENTS

JP          10-229288          8/1998

(Continued)

OTHER PUBLICATIONS

Sakamoto et al., U.S. Office Action mailed Nov. 13, 2009, directed to U.S. Appl. No. 12/239,286; 13 pages.

(Continued)

*Primary Examiner* — Yuriy Semenenko
*Assistant Examiner* — Andargie M Aychillhum
(74) *Attorney, Agent, or Firm* — Morrison & Foerster LLP

(57) ABSTRACT

Provided is a circuit device that allows a plurality of circuit boards, which are stacked each other and arranged in a case member, to be sealed with a resin effectively, and a method of manufacturing the same. In a hybrid integrated circuit device, a first circuit board is overlaid with the second circuit board and both of the boards are fitted into the case member. A first circuit element is arranged on the upper surface of the first circuit board and a second circuit element is arranged on the upper surface of the second circuit board. Furthermore, an opening is provided in a side wall part of the case member, and an internal space of the case member communicates with the outside through this opening. Accordingly, in the resin sealing step, a sealing resin can be injected into the internal space of the case member from the outside through this opening.

4 Claims, 10 Drawing Sheets

U.S. PATENT DOCUMENTS

| | | | |
|---|---|---|---|
| 5,657,203 A * | 8/1997 | Hirao et al. | 361/707 |
| 5,694,294 A | 12/1997 | Ohashi et al. | |
| 5,751,058 A | 5/1998 | Matsuki | |
| 5,777,846 A | 7/1998 | Hayes et al. | |
| 5,967,849 A | 10/1999 | Shiga et al. | |
| 5,995,380 A | 11/1999 | Maue et al. | |
| 6,027,535 A | 2/2000 | Eberle et al. | |
| 6,072,122 A | 6/2000 | Hosoya | |
| 6,081,425 A | 6/2000 | Cheng | |
| 6,144,571 A | 11/2000 | Sasaki et al. | |
| 6,147,869 A | 11/2000 | Furnival | |
| 6,166,908 A | 12/2000 | Samaras et al. | |
| 6,219,236 B1 * | 4/2001 | Hirano et al. | 361/695 |
| 6,226,182 B1 * | 5/2001 | Maehara | 361/695 |
| 6,304,448 B1 | 10/2001 | Fukada et al. | |
| 6,348,653 B1 | 2/2002 | Cho | |
| 6,350,949 B1 | 2/2002 | Boyd | |
| 6,421,244 B1 | 7/2002 | Shinohara et al. | |
| 6,509,629 B2 | 1/2003 | Yoshimatsu et al. | |
| 6,521,983 B1 * | 2/2003 | Yoshimatsu et al. | 257/678 |
| 6,583,355 B2 | 6/2003 | Skrzypchak | |
| 6,690,582 B2 | 2/2004 | Sumida | |
| 6,717,812 B1 | 4/2004 | Pinjala et al. | |
| 6,801,430 B1 | 10/2004 | Pokharna | |
| 6,958,535 B2 | 10/2005 | Hirano et al. | |
| 6,995,461 B2 | 2/2006 | Soyano et al. | |
| 7,209,367 B2 * | 4/2007 | Nakano et al. | 361/803 |
| 7,218,517 B2 | 5/2007 | Wolford et al. | |
| 7,248,471 B2 | 7/2007 | Wabiszczewicz | |
| 7,375,287 B2 | 5/2008 | Rathmann | |
| 7,589,978 B1 | 9/2009 | Holdredge et al. | |
| 7,623,347 B2 | 11/2009 | Matsui | |
| 7,706,146 B2 | 4/2010 | Lee et al. | |
| 7,751,194 B2 | 7/2010 | Sakamoto et al. | |
| 7,782,628 B2 | 8/2010 | Sakamoto et al. | |
| 7,839,655 B2 | 11/2010 | Clark | |
| 2008/0204998 A1 | 8/2008 | Matsui | |
| 2009/0086431 A1 | 4/2009 | Sakamoto et al. | |
| 2009/0086442 A1 | 4/2009 | Sakamoto et al. | |
| 2009/0086454 A1 | 4/2009 | Sakamoto et al. | |
| 2009/0086455 A1 | 4/2009 | Sakamoto et al. | |
| 2010/0284159 A1 | 11/2010 | Sakamoto et al. | |

FOREIGN PATENT DOCUMENTS

| | | |
|---|---|---|
| JP | 2000-228491 | 8/2000 |
| JP | 2007-36014 A | 2/2007 |

OTHER PUBLICATIONS

Sakamoto et al., U.S. Office Action mailed Dec. 16, 2009, directed to U.S. Appl. No. 12/239,250; 8 pages.

Sakamoto, H. et al., U.S. Office Action mailed Nov. 15, 2010, directed to a related U.S. Appl. No. 12/837,078; 7 pages.

Sakamoto, H. et al., U.S. Office Action mailed Apr. 25, 2011, directed to U.S. Appl. No. 12/837,078; 10 pages.

Sakamoto, H. et al., U.S. Office Action mailed May 10, 2011, directed to U.S. Appl. No. 12/239,407; 9 pages.

Sakamoto et al., U.S. Office Action mailed Oct. 5, 2011, directed to U.S. Appl. No. 12/239,215; 9 pages.

Sakamoto, H. et al., U.S. Office Action mailed Jul. 29, 2011, directed to U.S. Appl. No. 12/837,078; 11 pages.

* cited by examiner

CIRCUIT DEVICE AND METHOD OF MANUFACTURING THE SAME

This application claims priority from Japanese Patent Application Number JP 2007-250486 filed on Sep. 27, 2007, the content of which is incorporated herein by reference in its entirety.

BACKGROUND OF THE INVENTION

1. Field of the Invention

The present invention relates to a circuit device and a method of manufacturing the same, and in particular, relates to a circuit device, in which a hybrid integrated circuit formed on an upper surface of a circuit board is sealed with a case member, and a method of manufacturing the same.

2. Description of the Related Art

The configuration of a hybrid integrated circuit device 150 employing a case member 111 is described with reference to FIG. 10. The hybrid integrated circuit device 150 includes: a substrate 101 made of a metal, such as aluminum; an insulating layer 102 formed so as to cover the upper surface of the substrate 101; a conductive pattern 103 formed on the upper surface of the insulating layer 102; and a circuit element 110 such as a transistor electrically connected to the conductive pattern 103. Then, the circuit element 110 is sealed with the case member 111 and a sealing resin 108.

Specifically, the case member 111 has an approximately frame-like shape and is in contact with the side surface of the substrate 101. In addition, in order to secure a sealing space over the upper surface of the substrate 101, the upper end part of the case member 111 is positioned above the upper surface of the substrate 101. Then, the sealing resin 108 is filled in the space surrounded by the case member 111 above the substrate 101 so as to cover the circuit element 110 such as a semiconductor element. With this configuration, the circuit element mounted on the upper surface of the substrate 101 can be sealed with a sealing resin 108 for filling in the space surrounded by the case member 111, even if the substrate 101 is relatively large.

This technology is described for instance in Japanese Patent Application Publication No. 2007-036014.

In the hybrid integrated circuit device 150 described above, a power transistor, such as an insulated gate bipolar transistor (IGBT), and a driver IC for driving this power transistor are mounted on the upper surface of the substrate 101. In addition, a controlling element, such as a microcomputer, for controlling this driver IC, is mounted on the mounting substrate side on which the hybrid integrated circuit device 150 is mounted. Because of this configuration, the area required to mount a circuit which controls for driving a load, such as a motor, has to be large on the mounting substrate side.

For improving the packaging density of the hybrid integrated circuit device 150, a configuration is conceivable, in which a plurality of substrates 101 may be provided being overlaid with each other inside the case member 111 to mount the circuit element in each of the substrates 101. However, if a plurality of substrates 101 are fitted into the case member 111 in this manner, it is difficult to seal with a resin the space to be sealed by the case member 111 and the substrate 101.

SUMMARY OF THE INVENTION

It is thus an object of the present invention to provide a circuit device that allows a plurality of circuit boards, which are stacked on each other and arranged in the case member, to be sealed with a resin efficiently, and a method of manufacturing the same.

A circuit device according to the present invention comprises: a case member; a first circuit board and a second circuit board fitted into the case member and arranged in a way that the first circuit board is overlaid with the second circuit board; a first circuit element fixedly secured to a principal surface of the first circuit board; a second circuit element fixedly secured to a principal surface of the second circuit board; and a sealing resin covering at least the principal surface of the first circuit board and the first circuit element, wherein the case member is provided therein with an opening for allowing the sealing resin to be injected into an internal space of the case member.

A method of manufacturing a circuit device according to the present invention comprises the steps of: fitting, into a case member, a first circuit board having a first circuit element fixedly secured to a principal surface thereof; fitting, into the case member, a second circuit board having a second circuit element fixedly secured to a principal surface thereof; and injecting a sealing resin into an internal space surrounded by the case member, the first circuit board, and the second circuit board, to seal the principal surface of the first circuit board and the first circuit element, wherein in the injecting step, the sealing resin is injected into the internal space from an opening provided in the case member.

BRIEF DESCRIPTION OF THE DRAWINGS

FIG. 1A is a perspective view and FIG. 1B is a cross sectional view.

FIG. 2A is a cross sectional view and FIG. 2B is a cross sectional view.

FIG. 3A is a cross sectional view and FIG. 3B is a cross sectional view.

FIG. 6A is a cross sectional view and FIG. 6B is a cross sectional view.

FIG. 8A is a cross sectional view and FIG. 8B is a cross sectional view.

FIG. 9A is a cross sectional view and FIG. 9B is a plan view.

DESCRIPTION OF THE INVENTION

Figure 1A:
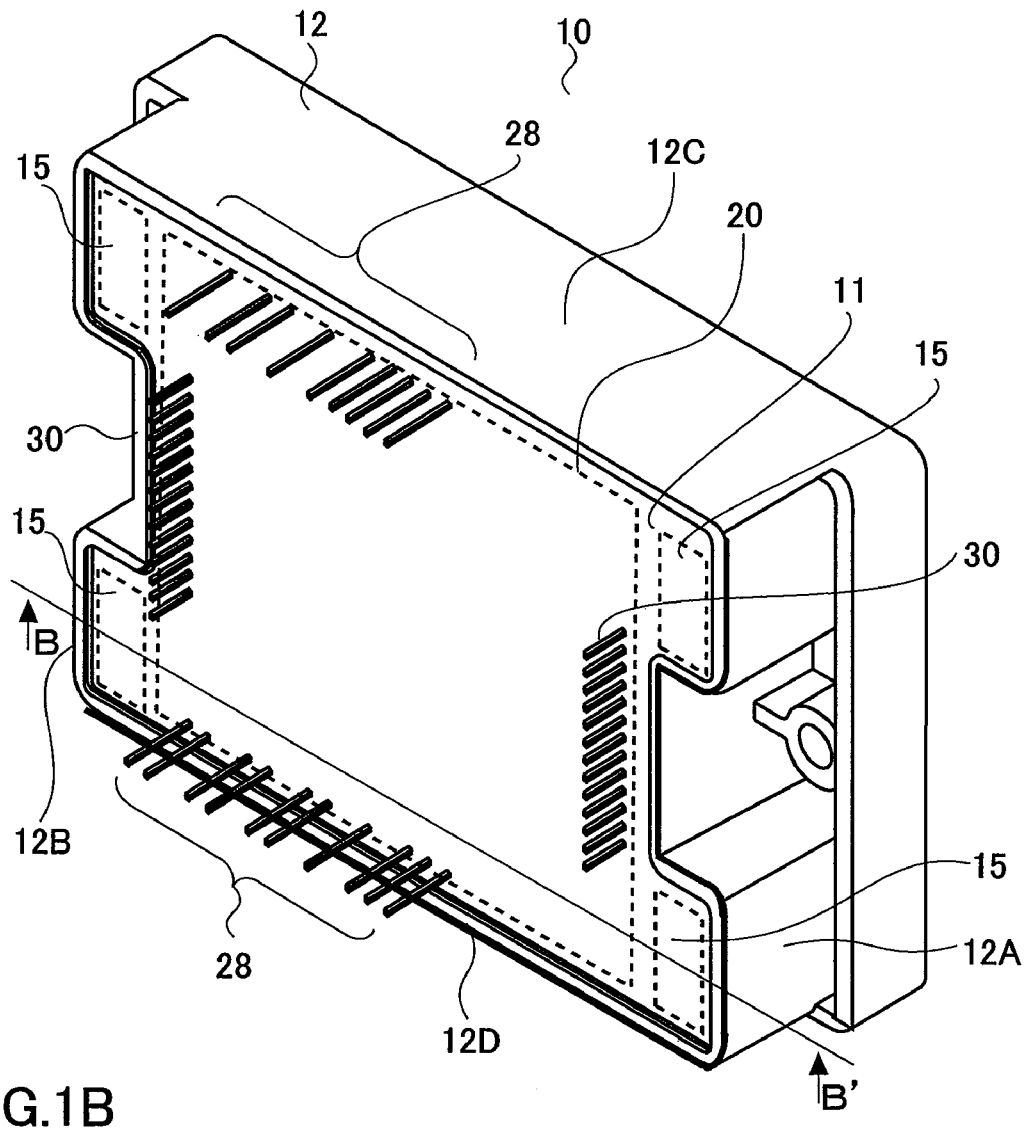
FIG. 1A and FIG. 1B are views showing a hybrid integrated circuit device that is an embodiment of a circuit device of the present invention.

As an example of the circuit device, the configuration of a hybrid integrated circuit device 10 is described with reference to FIGS. 1A and 1B. FIG. 1A is a perspective view of the hybrid integrated circuit device 10, and FIG. 1B is a cross sectional view of FIG. 1A taken along a B-B' line.

Figure 1B:
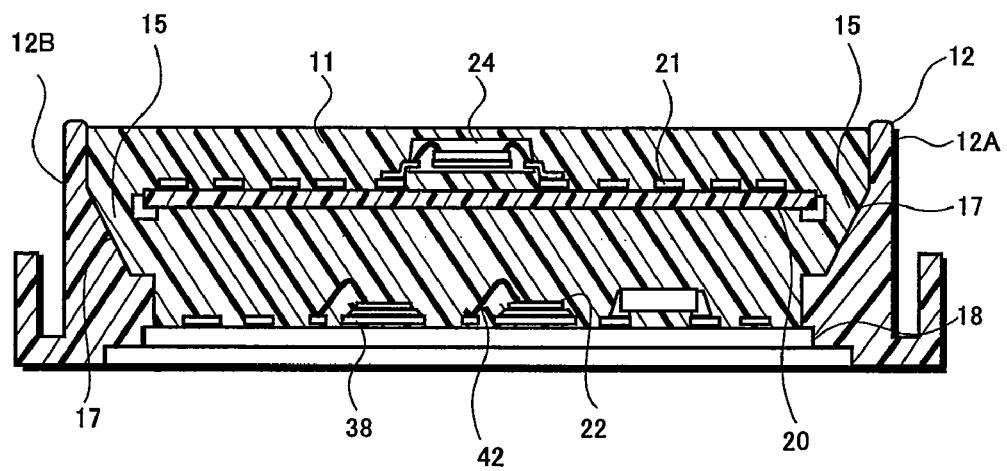

As shown in FIG. 1A and FIG. 1B, in the hybrid integrated circuit device 10, a first circuit board 18 is overlaid with a second circuit board 20 and both circuit boards are fitted into a case member 12. A first circuit element 22 (a power transistor, for example) is arranged on the upper surface of the first circuit board 18, and a second circuit element (a microcomputer, for example) is arranged on the upper surface of the second circuit board 20. Furthermore, the sealing resin 11 fills in the case member 12 to seal the upper surface of the first circuit board 18, the first circuit element 22, the second circuit board 20, and the second circuit element 24.

The case member 12 is formed by injection molding a thermosetting resin, such as an epoxy resin, or a thermoplastic resin, such as an acrylic resin, and exhibits an approximately frame-like shape. As shown in FIG. 1B, the upper surface and the lower surface of the case member 12 form openings, and the opening in the upper surface is covered with the second circuit board 20, and the opening in the lower surface is covered with the first circuit board 18. In addition, screw holes for fastening screws are provided at the left and right end portions of the case member 12, respectively. Furthermore, as shown in FIG. 1A, the case member 12 mainly consists of a first side wall part 12A and a second side wall part 12B that surface to each other horizontally of the figure, and a third side wall part 12C and a fourth side wall part 12D that surface to each other vertically of the figure.

Additionally, four openings 15 for allowing the sealing resin 11 to be injected into the internal space in the manufacturing process are provided at the corner portions of the case member 12. These openings 15 serve as a path for allowing the sealing resin 11 to be injected into the internal space of the case member 12 in the step of forming the sealing resin 11. The detail of this part will be described later.

The first circuit board 18 is fitted into the lower opening of the case member 12, and is made of aluminum (Al), copper (Cu), or an alloy containing one of these metals as a primary material. Although here, two metal substrates made of aluminum are employed as the first circuit board 18, the first circuit board 18 may be consisted of one metal substrate. The detail of the first circuit board 18 will be described with reference to FIG. 2B.

The second circuit board 20 is fitted into the opening on the upper side of the case member 12, and here a printed circuit board (PCB) is employed. Specifically, a paper phenol substrate, a glass epoxy substrate, or the like is employed as the second circuit board 20. Alternatively, a substrate made of ceramic may be employed as the second circuit board 20. In addition, a conductive pattern 21 may be formed only on the upper surface of the second circuit board 20, or the conductive pattern 21 may be provided on both sides thereof. In addition, the conductive pattern 21 stacked in three or more layers may be formed on the second circuit board 20.

The first circuit element 22 is an element electrically connected to the conductive pattern 38 formed on the upper surface of the first circuit board 18. As the first circuit element 22, a power transistor for switching a current equal to or more than one ampere is employed, for example. Here, a bipolar transistor, a field effect transistor (FET), or an insulated gate bipolar transistor (IGBT) is employed as the power transistor. In addition, as the first circuit element 22, an element other than the transistor also can be generally employed, and for example, an active element, such as an LSI or a diode, or a passive element, such as a chip capacitor or a chip resistor, is employed.

Additionally, if the first circuit element 22 is a semiconductor element, such as a power transistor, the rear surface thereof is fixedly secured via a conductive adhesive, such as solder. In addition, a heat sink made of a metal, such as copper, may be provided between the first circuit element 22 and the conductive pattern 38. Then, an electrode formed on the upper surface of the first circuit element 22 is connected to the conductive pattern 38 via a metal thin wire 42.

In addition, a diode constituting a rectifier circuit, a coil and a capacitor constituting a smoothing circuit, a driver IC which applies a control signal to the control electrode of the above-described power transistor, a thermistor, and the like are employed as the first circuit element 22.

The second circuit element 24 is an element electrically connected to the conductive pattern 21 formed on the surface of the second circuit board 20, and a circuit element having a lower operating temperature than the first circuit element 22 is generally employed. As a specific example, for example, a microcomputer, an aluminum electrolytic capacitor, and the like are mounted on the second circuit board 20 as the second circuit element 24. In addition, as the second circuit element 24, an active element and a passive element are generally employed as is the case with the first circuit element 22. Alternatively, a crystal oscillator or a semiconductor memory may be employed as the second circuit element 24.

Additionally, as shown in FIG. 1B, the LSI, which is a microcomputer, is mounted on the upper surface of the second circuit board 20, in the form of a resin sealed package. However, the microcomputer may be fixedly secured to the conductive pattern 21 formed on the surface of the second circuit board 20, in the form of a bare chip.

The sealing resin 11 is filled inside the case member 12 so as to cover the circuit element fixedly secured to each of the circuit boards. Specifically, the sealing resin 11 is filled in the internal space surrounded by the respective side wall parts of the case member 12, the first circuit board 18, and the second circuit board 20. Furthermore, the sealing resin 11 is formed so as to cover the upper surface of the second circuit board 20 and the second circuit element 24. The sealing resin 11 is made of a resin material, such as an epoxy resin in which a filler, such as alumina ($Al_2O_3$) or silica ($SiO_2$), is mixed. In this way, covering the first circuit element 22 and the second circuit element 24 with a sealing resin makes the moisture resistance and the vibration resistance of these elements to be improved.

As shown in FIG. 1A, the opening on the front side of the case member 12 is entirely covered with the sealing resin 11, and a first lead 28 and a second lead 30 are led from the surface of the sealing resin 11 to the outside. The details of the first lead 28 and the second lead 30 will be described with reference to FIG. 2A. The first lead 28 and the second lead 30 serve as a connecting means for connecting a circuit provided inside the hybrid integrated circuit device 10 to the outside. Additionally, as shown in FIG. 1B, the first lead 28 serves also as a connecting means for electrically connecting the first circuit element 22 mounted on the first circuit board 18 and the second circuit element 24 mounted on the second circuit board 20. Additionally, the opening 15 provided in the case member 12 is also covered with the sealing resin 11, and in FIG. 1A the outer edge of the opening 15 is indicated by a dotted line.

In this embodiment, the opening 15 for allowing a resin to be injected in the internal space of the case member 12 is provided in the case member 12. Specifically, in order to integrally seal the first circuit board 18 and the second circuit board 20 with a resin, the sealing resin 11 is formed after the first circuit board 18 and the second circuit board are bonded to the case member 12 and fitted thereinto. Accordingly, an opening for allowing the sealing resin 11 to be injected into the internal space of the case member 12 needs to be secured. Additionally, if this opening is to be provided by partially removing the first circuit board 18 or the second circuit board 20, a large number of circuit elements can not be mounted thereon, with the reduction of the area of this circuit board.

From this point of view, in this embodiment, the opening for allowing the sealing resin 11 to be injected is provided in the case member 12. Specifically, as shown in FIG. 1A, the first side wall part 12A of the case member 12 is partially projected outwardly so that the opening 15 is formed around the side of the second circuit board 20. By providing the opening 15 in the case member 12 in this manner, there is no need to reduce the area of the first circuit board 18 or the second circuit board 20, and therefore the packaging density of the whole device will not be reduced.

Furthermore, as shown in FIG. 1B, the inner wall of the first side wall part 12A facing the opening 15 forms an inclined surface, i.e. the lower part thereof is positioned more inside than the upper part thereof. With this configuration, in the resin sealing step, the sealing resin 11 injected from above the opening 15 flows inwardly along the inclined surface 17, and finally the internal space of the case member 12 is filled with the sealing resin 11. The same is true of the configuration of the second side wall part 12B facing the opening 15. Additionally, in this embodiment, a plurality of openings 15 are provided in the case member 12, so if the sealing resin 11 is injected into the internal space of the case member 12 from one of the openings 15, then the air in the internal space will be released from the other openings 15. Accordingly, the resin is easily injected into the internal space of the case member 12.

Figure 2A:
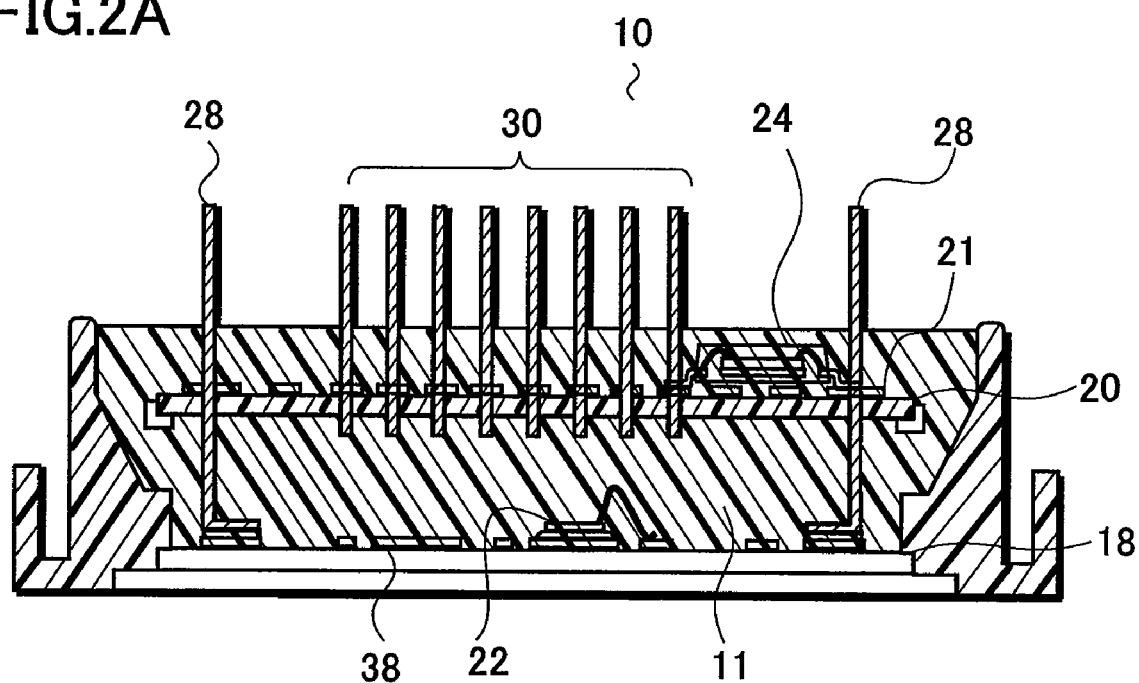
FIG. 2A and FIG. 2B are views showing the hybrid integrated circuit device that is the embodiment of the circuit device of the present invention.
Figure 2B:
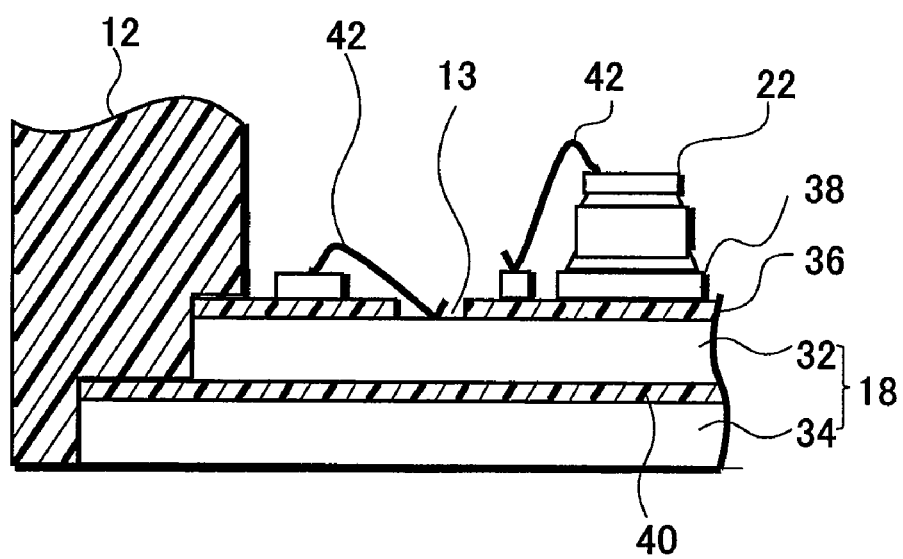

The configuration of the above-described hybrid integrated circuit device 10 is further described with reference to FIG. 2A and FIG. 2B. FIG. 2A is a cross sectional view of the hybrid integrated circuit device 10 for illustrating the configuration of leads, and FIG. 2B is a cross sectional view for explaining the configuration of the first circuit board 18.

As shown in FIG. 2A, the first lead 28 and the second lead 30 are provided in the hybrid integrated circuit device 10.

The lower end of the first lead 28 is fixedly secured to a pad consisted of a conductive pattern 38 formed on the upper surface of the first circuit board 18. The lower end of the first lead 28 is bonded to the pad-like conductive pattern 38 via a conductive adhesive, such as solder. The upper end of the first lead 28 is led to the outside penetrating the sealing resin 11 and the second circuit board 20. Here, in a porting where the first lead 28 penetrates the second circuit board 20, the first lead 28 is sometimes connected to the second circuit element fixedly secured to the upper surface of the second circuit board 20 or is not sometimes connected thereto. The cases where the first lead 28 is connected to the second circuit element 24 include a case where the second circuit element 24 mounted on the second circuit board 20 and the first circuit element 22 mounted on the first circuit board 18 are electrically connected to each other via the first lead 28. Additionally, the cases where the first lead 28 and the second circuit element 24 are not connected to each other might include, for example, a case where a power supply current supplied from the outside passes through the first lead 28, or a case where a current converted by an inverter circuit provided in the first circuit board 18 is supplied through the first lead 28 to the outside.

The lower end of the second lead 30 is connected to the conductive pattern 21 provided on the upper surface of the second circuit board 20 and the upper end thereof projects upward penetrating the sealing resin 11. The lower end of the second lead 30 is inserted into a pore which is provided penetrating the second circuit board 20, and a portion near the lower end thereof is secured to the pore. This portion has a function to allow an electric signal, which is inputted to and outputted from the second circuit element 24 mounted on the second circuit board 20, to pass therethrough. Here, the conductive pattern 21 formed on the upper surface of the second circuit board 20 and the second lead 30 are connected to each other via a conductive adhesive, such as solder.

As shown in FIG. 2B, in this form, the first circuit board 18 is formed by stacking a mounting substrate 32 on an insulating substrate 34.

The mounting substrate 32 is a metal substrate containing aluminum (Al) as the primary material, with the thickness of around 1.0 mm to 2.0 mm and the upper surface and the lower surface thereof are covered with anodic oxide film (a film made of $Al_2O_3$). The upper surface of the mounting substrate 32 is covered with an insulating layer 36 made of a resin material, such as an epoxy resin in which a filler is highly filled. The thickness of the insulating layer 36 is around 50 μm for example. In addition, the conductive pattern 38 with the thickness of around 50 μm made of copper is formed on the upper surface of the insulating layer 36, and the first circuit element 22 is mounted on the conductive pattern 38.

Additionally, an exposed portion 13 is provided by partially removing the insulating layer 36, and the mounting substrate 32 appeared from the exposed portion 13 and the conductive pattern 38 are connected to each other via the metal thin wire 42. Connecting the mounting substrate 32 and the conductive pattern 38 to each other via the exposed portion 13 in this way allows the potential of the mounting substrate 32 to be set at a fixed potential (earth potential or power supply potential). Accordingly, the mounting substrate 32 contributes to the increase of the shielding effect for shielding noise from the outside. In addition, since the potentials of a part of the conductive pattern 38 and the mounting substrate 32 become the same, a parasitic capacitance occurring between both can be reduced.

The rear surface of the mounting substrate 32 having the above-described structure is bonded to the upper surface of the insulating substrate 34 via an adhesive made of a silicon resin.

The insulating substrate 34 is made of a metal, such as aluminum, as is the case with the mounting substrate 32, and the plane size thereof is formed larger than that of the mounting substrate 32. Accordingly, the end portion of the insulating substrate 34 is spaced apart from the end portion of the mounting substrate 32. Additionally, the upper surface of the insulating substrate 34 is covered with an insulating layer 40 made of a resin material, such as a polyimide resin. In addition, the lower surface of the insulating substrate 34 is arranged on the same plane as the lower end of the side wall of the case member 12.

As described above, both of the heat release property and the withstand voltage of the first circuit board 18 can be kept at a high level with the configuration of the first circuit board 18 by stacking the mounting substrate 32 on the insulating substrate 34. Specifically, as described above, since the mounting substrate 32 is connected to the earth potential for example, by being connected to the conductive pattern 38, an exposure of the rear surface of the mounting substrate 32 to the outside might cause a short circuit. The insulating substrate 34 is provided in order to prevent this short circuit. The upper surface of the insulating substrate 34 and the lower surface of the mounting substrate 32 are insulated from each other by the insulating layer 40 provided on the upper surface of the insulating substrate 34. In addition, the side surface of the mounting substrate 32 and the side surface of the insulating substrate 34 are prevented from being short-circuited to each other by keeping a distance between the end portion (side surface) of the insulating substrate 34 and the end portion (side surface) of the mounting substrate 32, although the side surfaces of both substrates are the surfaces where a metallic material, such as aluminum, constituting the respective substrates appears.

In addition, since both of the mounting substrate 32 and the insulating substrate 34 are made of a metal, such as aluminum being excellent in heat release property, a heat generated in the first circuit element 22 is excellently released to the outside via the mounting substrate 32 and the insulating substrate 34.

Figure 3A:
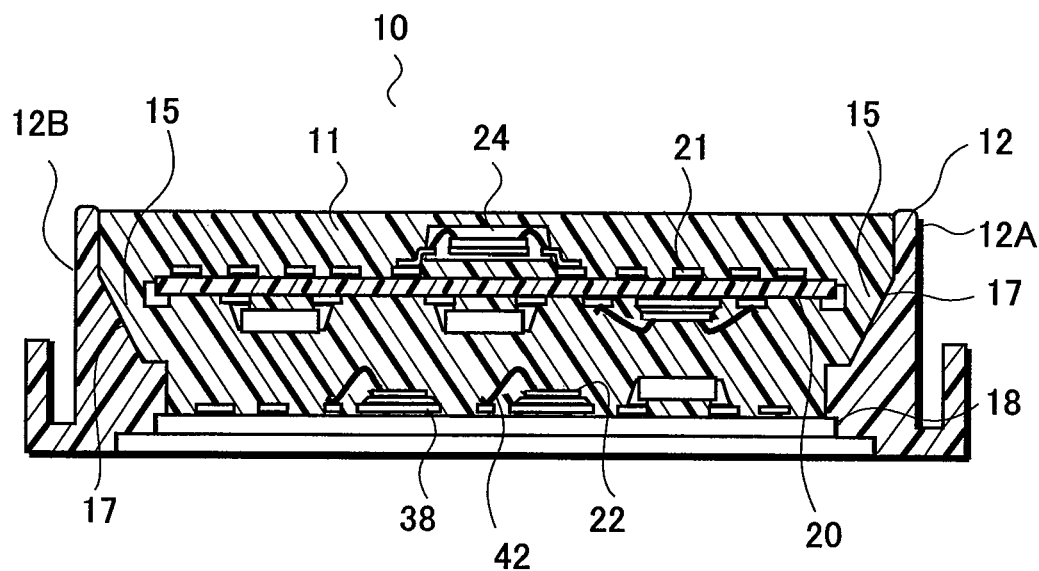
FIG. 3A and FIG. 3B are views showing a hybrid integrated circuit device that is an embodiment of the circuit device of the present invention.

Another form of the hybrid integrated circuit device 10 is described with reference to FIG. 3A. Here, the second circuit elements 24 are mounted respectively on both of the upper surface and the lower surface of the second circuit board 20. By providing the second circuit element 24 also on the lower surface of the second circuit board 20 in this way, a greater number of circuit elements can be mounted in the hybrid integrated circuit device 10.

Figure 3B:
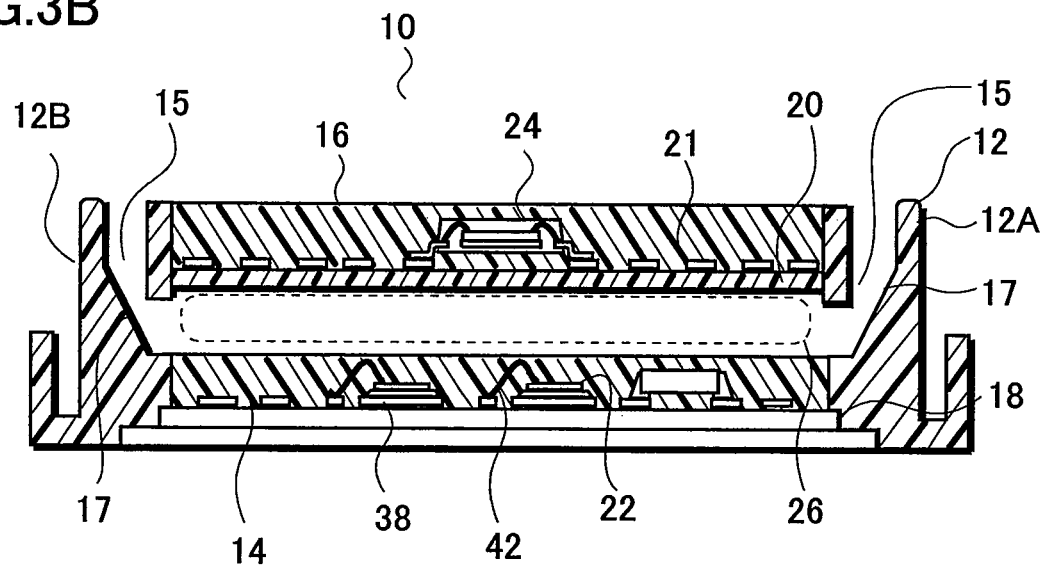

The configuration of still another form of the hybrid integrated circuit device 10 is described with reference to FIG. 3B. In the hybrid integrated circuit device 10 shown in FIG. 3B, the internal space of the case member 12 is not integrally sealed with a resin, but a hollow portion 26, which is a space that is not sealed with a resin, is formed inside the case member 12. Specifically, in the internal space of the case member 12, the upper surface of the first circuit board 18 and the first circuit element 22 are sealed with a first sealing resin 14. On the other hand, the upper surface of the second circuit board 20 and the second circuit element 24 are covered with a second sealing resin 16 that is a different resin from the first sealing resin 14. Here, the first sealing resin 14 covering the upper surface of the first circuit board 18 is supplied to the inside the case member 12 through the opening 15 provided in the case member 12. Additionally, the compositions of the first sealing resin 14 and the second sealing resin 16 may be the same as that of the sealing resin 11.

By providing, in the internal space of the case member 12, the hollow portion 26 that is not sealed with a resin, the first circuit element 22 placed on the upper surface of the first circuit board 18 and the second circuit element 24 placed on the second circuit board 20 can be thermally separated from each other to suppress their thermal interference. For example, if the first circuit element 22 is a power transistor and the second circuit element 24 is a microcomputer, by employing such a configuration, a situation can be prevented that a heat generated from the power transistor is conducted to the microcomputer, which is then overheated and causes a misoperation.

Figure 4:
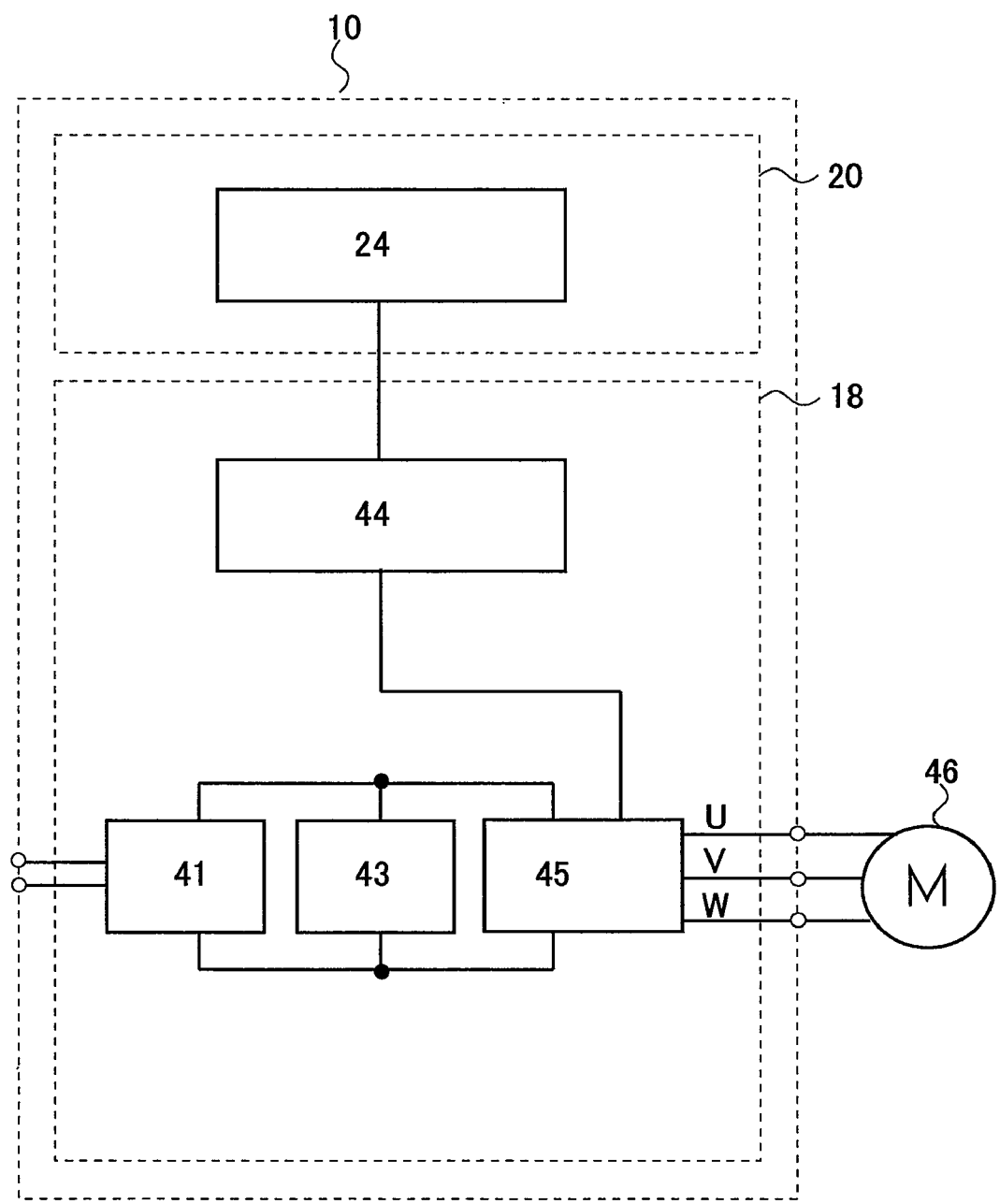
FIG. 4 is a block diagram showing a circuit incorporated in the hybrid integrated circuit device that is the embodiment of the circuit device of the present invention.

Next, an example of the circuit built in the hybrid integrated circuit device 10 is described with reference to FIG. 4. Here, an inverter circuit including a switching circuit 45 consisted of a plurality of power transistors is formed on the first circuit board 18, while the second circuit element 24 (microcomputer) in which a control circuit for controlling this inverter circuit is configured is mounted on the second circuit board 20. More specifically, a rectifier circuit 41, a smoothing circuit 43, a switching circuit 45, and a driver IC 44 are mounted in the first circuit board 18.

The operation of each of the circuits incorporated in the hybrid integrated circuit device 10 is described below. Firstly, a reference signal having a frequency corresponding to a rotational speed is inputted to the second circuit element 24 (microcomputer), which is mounted on the second circuit board 20, so that three sinewave control signals each having a pulse width being modulated and a phase difference by 120 degrees are generated. The control signal generated by the second circuit element 24 is inputted to the driver IC 44 of the first circuit board 18 via the first lead 28 (see FIG. 2A).

The control signal inputted to the first circuit board 18 is boosted to a specified voltage by a driver IC 44 and then is applied to a control electrode of a power transistor (IGBT, for example) constituting the switching circuit 45.

On the other hand, an alternating current power inputted from the outside is converted into a direct current power by the rectifier circuit 41, and then the voltage thereof is kept constant by the smoothing circuit 43, and this voltage is inputted to the switching circuit 45.

Then, the switching circuit 45 generates three-phase pulse-width-modulated sinewave voltages (U, V, W), each having a phase difference by 120 degrees, and the voltages thus generated are supplied to a motor 46. As a result, a load current that approximates the sinewave flows into the motor 46, so that the motor 46 rotates at a predetermined number of rotations.

Figure 5A:
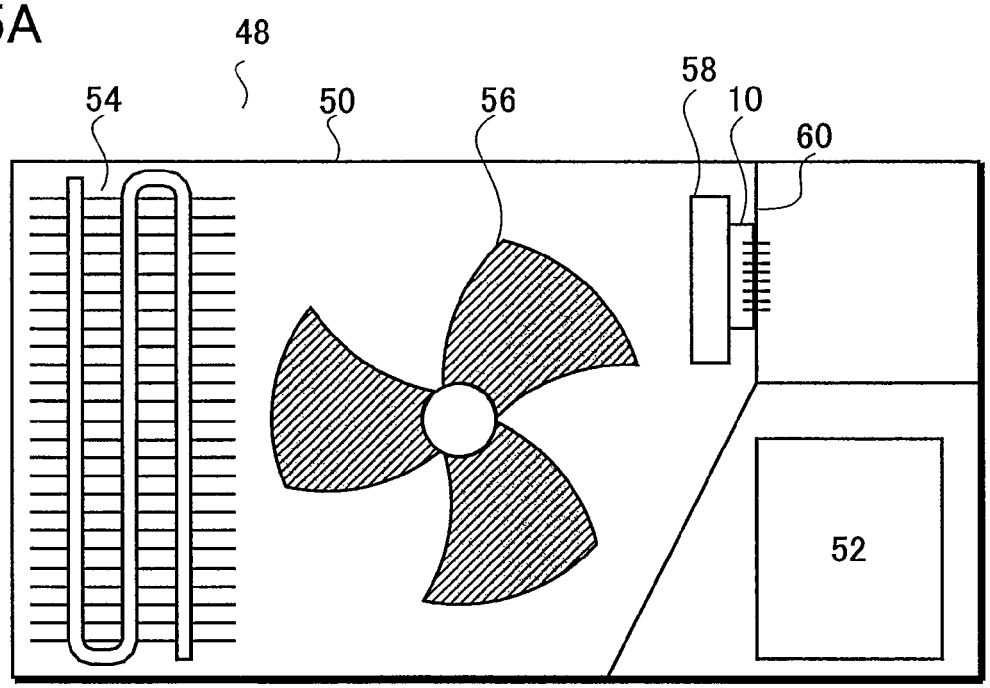
FIG. 5A is a view showing an outdoor unit, into which the hybrid integrated circuit device that is the embodiment of the circuit device of the present invention is incorporated.

Next, the configuration of an outdoor unit 48 of an air conditioner, in which the hybrid integrated circuit device 10 having the above-described configuration is incorporated, is described with reference to FIG. 5A and FIG. 5B.

The outdoor unit 48 mainly includes a condenser 54, a fan 56, a compressor 52, and the hybrid integrated circuit device 10 which are mounted inside a housing 50.

The compressor 52 has a function to compress a refrigerant, such as ammonia, using the driving force of the motor. Then, the refrigerant compressed by the compressor 52 is delivered to the condenser 54, and the wind from the fan 56 blows to the condenser 54. Accordingly a heat contained in the refrigerant inside the condenser 54 is released to the outside. In addition, after being expanded, this refrigerant is delivered to an evaporator existing in the room so as to cool the air in the room.

The hybrid integrated circuit device 10 of this form has a function to control the rotation of the motor for driving the compressor 52 or the fan 56, and is fixedly secured to a mounting substrate 60 provided inside the outdoor unit 48.

Figure 5B:
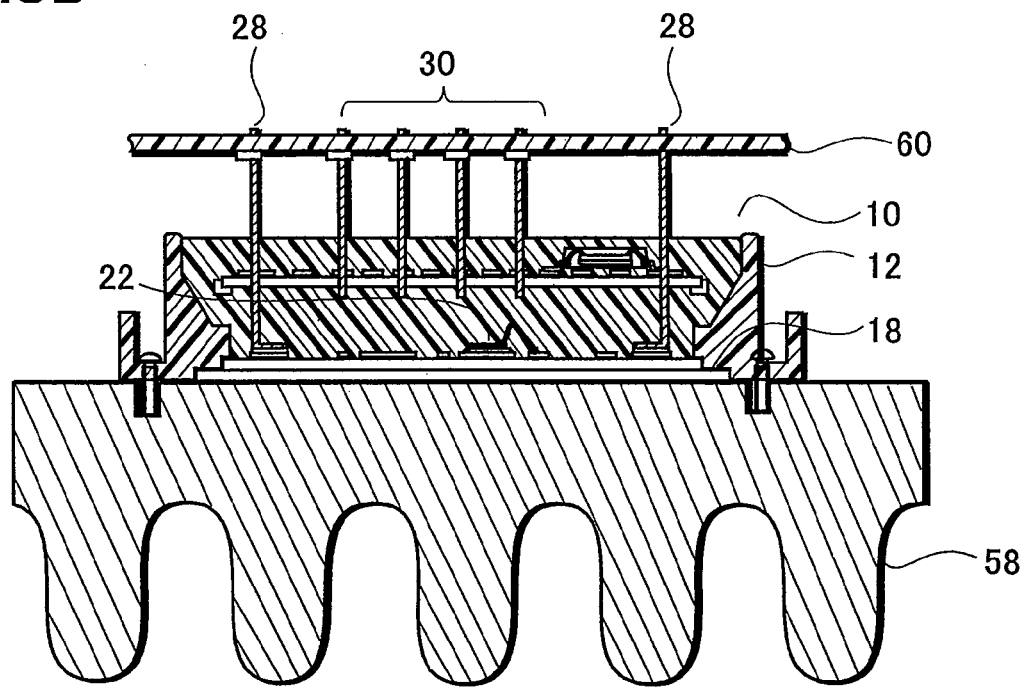
FIG. 5B is a cross sectional view of a portion to which the hybrid integrated circuit device is attached.

FIG. 5B shows a structure how the hybrid integrated circuit device 10 is mounted. Here, the first lead 28 and the second lead 30 are inserted into the mounting substrate 60 to be mounted thereon. The rear surface of the first circuit board 18 on which the power transistors are mounted is in contact with a smooth surface of a heat sink 58. The hybrid integrated circuit device 10 can be attached to the heat sink 58 by screwing the case member 12 of the hybrid integrated circuit device 10 into the heat sink 58. Here, the heat sink 58 is formed by integrally molding a metal, such as copper or aluminum. The surface of the heat sink being in contact with the hybrid integrated circuit device 10 is smooth, and the surface opposite thereto is irregular. With such a configuration, a heat generated in the first circuit element 22, which is the power transistor, is conducted to the internal space of the outdoor unit 48 via the first circuit board 18 and the heat sink 58, and is finally released to the outside of the outdoor unit 48 by the blowing operation of the fan 56.

Subsequently, a method of manufacturing the hybrid integrated circuit device 10 whose configuration is shown in FIG. 1 is explained with reference to the FIGS. 6A, 6B, 7, 8A and 8B.

Figure 6A:
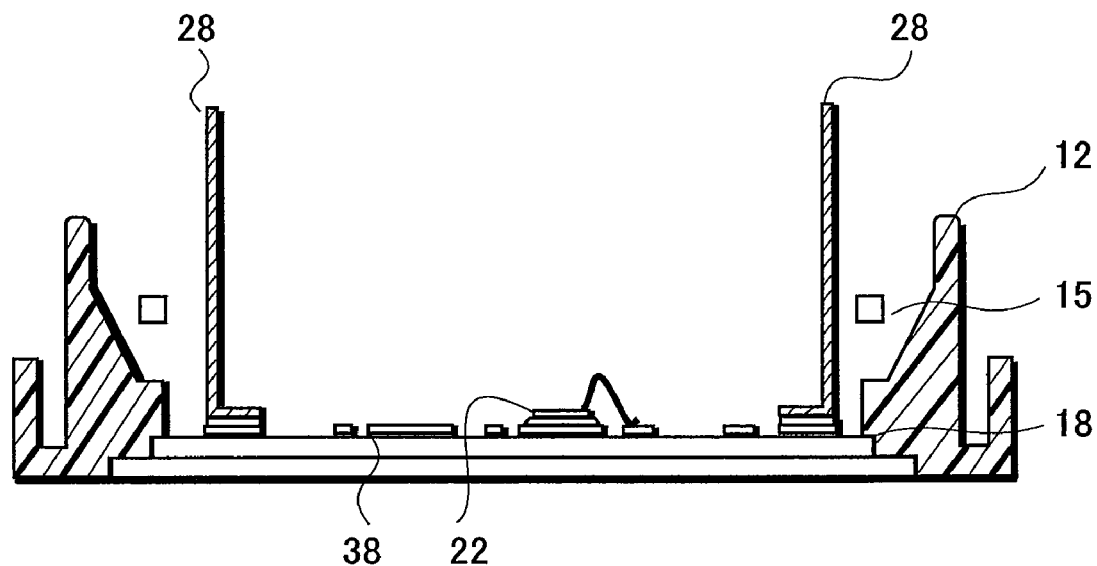
FIG. 6A and FIG. 6B are views showing a method of manufacturing the hybrid integrated circuit device that is the embodiment of the circuit device of the present invention.

As shown in FIG. 6A, firstly, the first circuit board 18 having a predetermined hybrid integrated circuit being mounted on the upper surface thereof is fitted into the case member 12.

The conductive pattern 38 in a predetermined shape is mounted on the upper surface of the first circuit board 18 in advance, and the first circuit element 22, such as a power transistor, is mounted on the conductive pattern 38 at a predetermined portion so that the conductive pattern 38 and the first circuit element 22 are electrically connected. In addition, the first lead 28 is fixedly secured on the pad-like conductive pattern 38, via a conductive adhesive such as solder. Here the first lead 28 may be fixedly secured to the conductive pattern 38 in a lead-frame state, in which a plurality of first leads 28 are connected with each other. Additionally, the opening 15 having the above-described configuration is provided in the case member 12.

The first circuit board 18 having such a configuration is fitted in the lower opening of the case member 12. The details of the first circuit board 18 is, as described above, consisted of a combined substrate made of two metal substrates as shown in FIG. 2B. However, the first circuit board 18 may be consisted of one metal substrate.

Figure 6B:
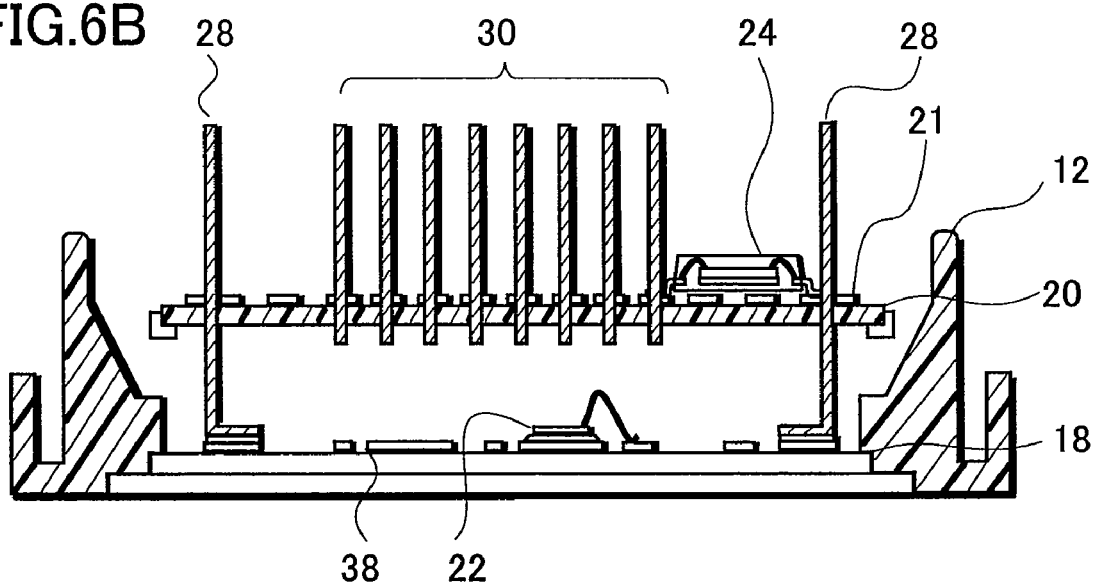

Next, as shown in FIG. 6B, the second circuit board 20 having the predetermined second circuit element 24 mounted therein is fitted into the case member 12. The conductive pattern 21 having a predetermined shape is formed on the upper surface of the second circuit board 20, and the second circuit element 24, which is a microcomputer, for example, is fixedly secured to the conductive pattern 21. Additionally, the second lead 30 connected to the second circuit element 24 is fixedly secured to the upper surface of the second circuit board 20.

Furthermore, in a portion corresponding to the first lead 28 of the second circuit board 20, a through-hole is provided by opening the second circuit board 20 by drilling or laser irradiation processing, and the first lead 28 penetrates this through-hole. Note that a gap between the through-hole provided in the second circuit board 20 and the first lead 28 is filled with a bonding material, such as solder.

Figure 7:
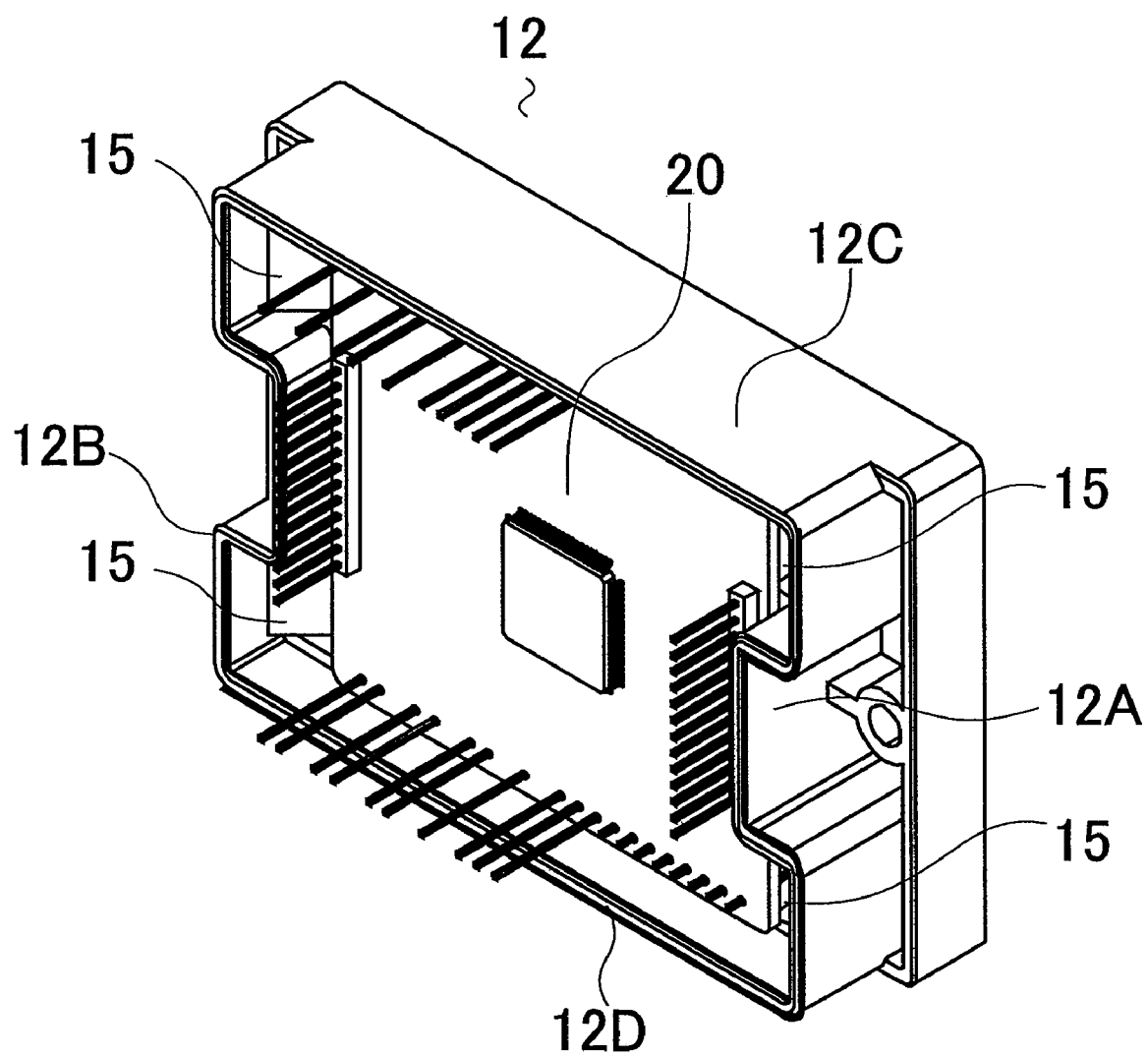
FIG. 7 is a perspective view showing the hybrid integrated circuit device that is the embodiment of the circuit device of the present invention.

FIG. 7 shows a perspective view of the case member 12 after this step is finished. As shown in FIG. 7, the case member 12 consists of the first side wall part 12A, the second side wall part 12B, the third side wall part 12C, and the fourth side wall part 12D. The opening 15 is formed by partially expanding the first side wall part 12A and the second side wall part 12B to the lateral side (to the outside). Through this opening 15, the internal space of the case member 12 communicates with the outside, and a sealing resin is supplied to the internal space through the opening 15 in a subsequent step.

The provision of the opening by expanding the side wall part of the case member 12 outwardly in this manner eliminates a need to provide the opening 15 by deforming the second circuit board 20. Accordingly, the second circuit board 20 can be used in the original square shape without reducing the area thereof, so the packaging density of the second circuit board 20 can be improved.

Furthermore, here, two openings 15 are provided in the first side wall part 12A and two openings 15 are provided also in the second side wall part 12B opposite to the first side wall part 12A, and thus a total of four openings 15 are provided. However, the number of openings 15 formed in the case member 12 may be less than four, may be one, or may be more than four.

As shown in FIG. 8, next, the sealing resin 11 is formed so as to cover the upper surface of the first circuit board 18 and the upper surface of the second circuit board 20.

Figure 8A:
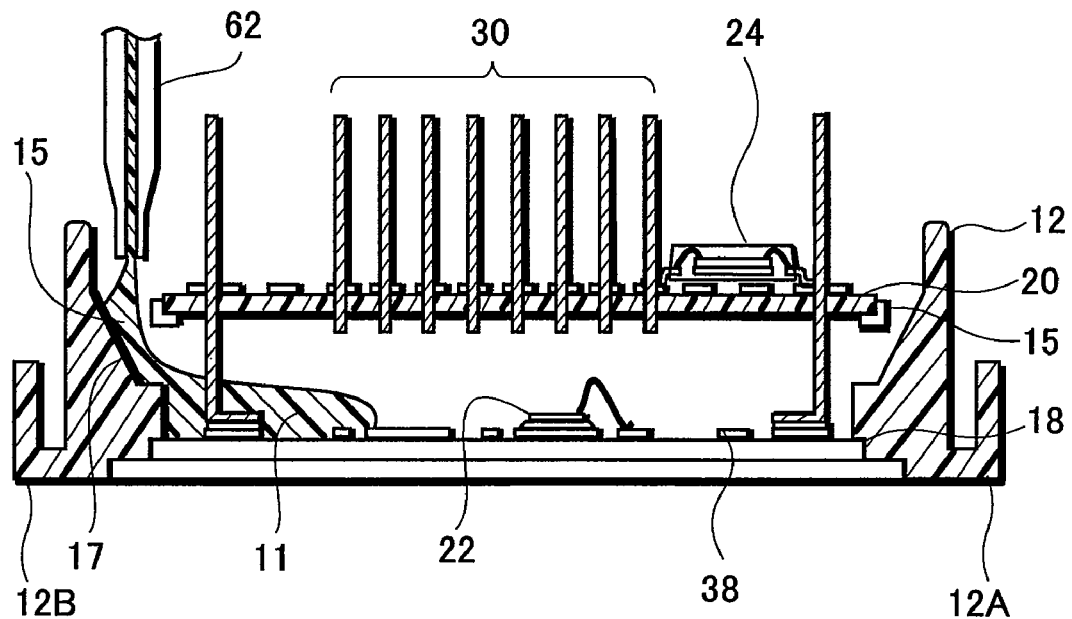
FIG. 8A and FIG. 8B are views showing a method of manufacturing the hybrid integrated circuit device that is the embodiment of the circuit device of the present invention.

As shown in FIG. 8A, in this step, the sealing resin 11 is injected into the internal space of the case member 12 from the opening 15 provided in the case member 12. Firstly, the upper surface of the first circuit board 18 and the first circuit element 22 that are positioned in the internal space of the case member 12 are sealed with a resin. The sealing resin 11 used in this step is a thermosetting resin or a thermoplastic resin filled with a filler, such as granular alumina. The sealing resin 11 supplied from a nozzle 62 is in a liquid or semi-solid state, and is heat-cured after being filled.

Here, the sealing resin 11 is supplied from the nozzle 62 to the internal space in the case member 12 through the opening 15 provided in the second side wall part 12B on the left of the figure. Additionally, the opening 15 is also provided in the first side wall part 12A positioned on the right of the figure, and the amount of air in the internal space corresponding to that of the sealing resin 11 supplied from the nozzle 62 is released to the outside through the opening 15 provided in the first side wall part 12A.

If a supply of the sealing resin 11 by the nozzle 62 is continued, the internal space (space surrounded by the case member 12, the first circuit board 18, and the second circuit board 20) of the case member 12 is filled with the sealing resin 11.

Figure 8B:
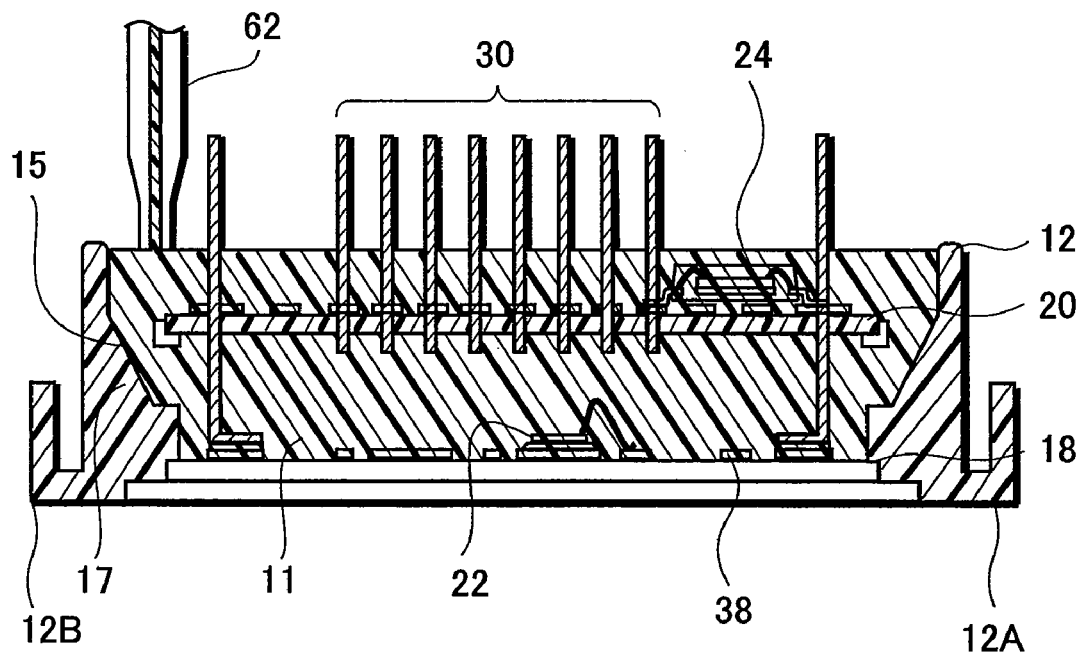

As shown in FIG. 8B, if the supply of the sealing resin 11 is continued further, the upper surface of the second circuit board 20 and the second circuit element 24 will be covered. Accordingly, in this step, the upper surface of the first circuit board 18, the first circuit element 22, the upper surface of the second circuit board 20, and the second circuit element 24 are integrally sealed with the sealing resin 11.

Furthermore, in this step, as shown in FIG. 8A, the liquid sealing resin 11 supplied from the nozzle 62 is firstly in contact with the inclined surface 17 provided in the inner wall of the second side wall part 12B. Then, the sealing resin 11 having excellent fluidity enters into the internal space of the case member 12 along the inclined surface 17. As a result, the sealing resin 11 injected through the opening 15 is filled in the internal space of the case member 12 without leaving space therein.

Through the above-described steps, the hybrid integrated circuit device 10 whose structure is shown in FIG. 1 is manufactured.

Here, the upper surface of the first circuit board 18 and the upper surface of the second circuit board 20 may be sealed with a resin individually. In other words, as shown in FIG. 3B, the upper surface of the first circuit board 18 may be sealed with the first sealing resin 14 and the upper surface of the second circuit board 20 and the second circuit element 24 may be sealed with the second sealing resin 16. Also in this case, the first sealing resin 14 is supplied from the opening 15.

Figure 9A:
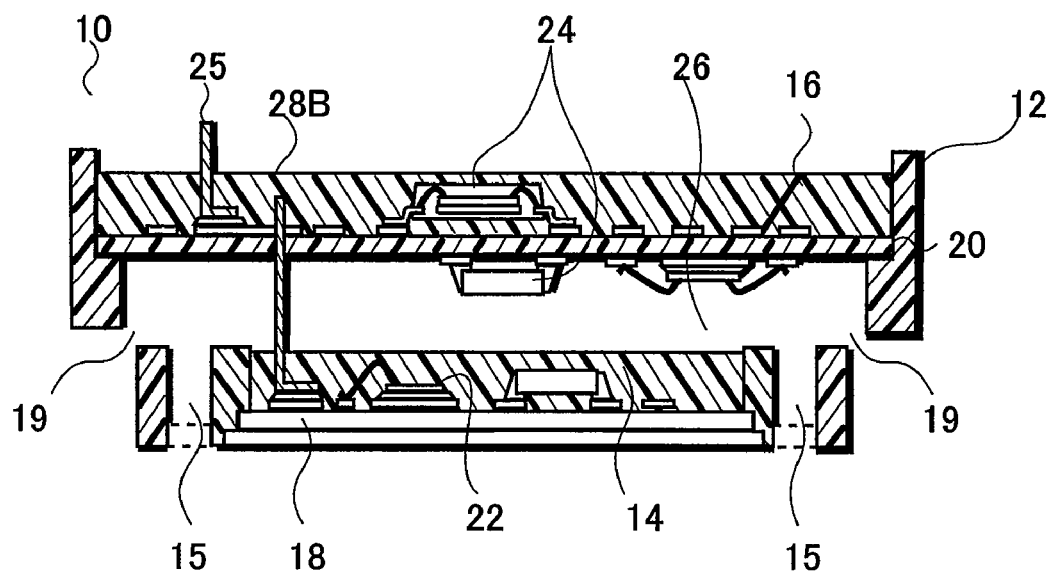
FIG. 9A and FIG. 9B are views showing a hybrid integrated circuit device that is an embodiment of the circuit device of the present invention.
Figure 9B:
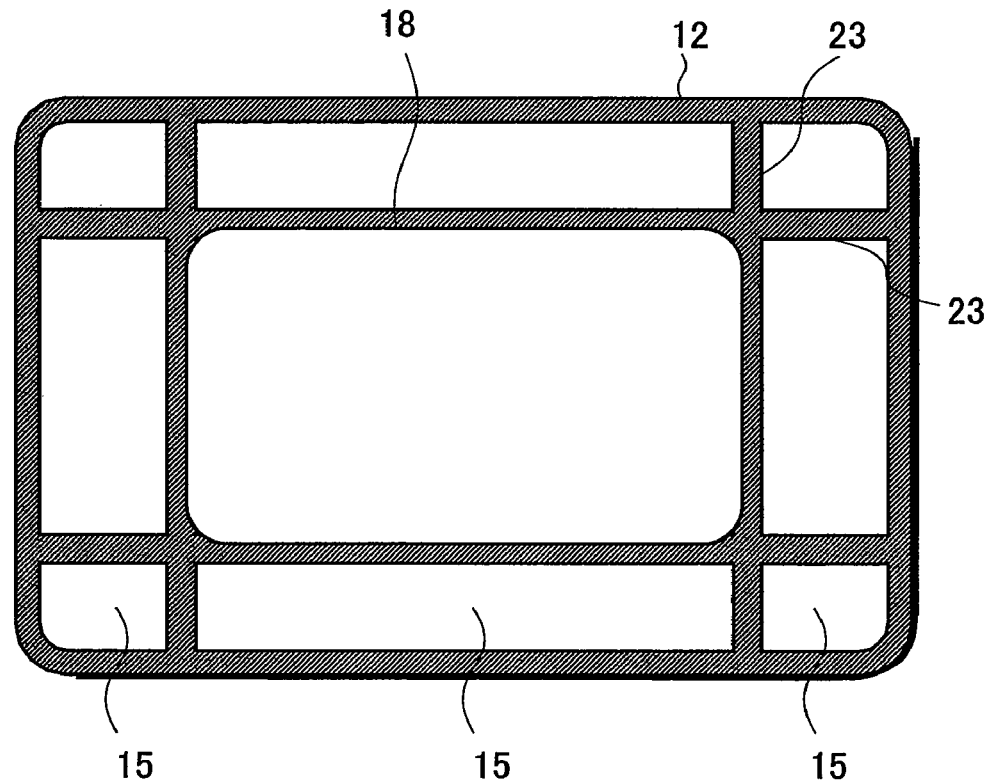
Figure 10:
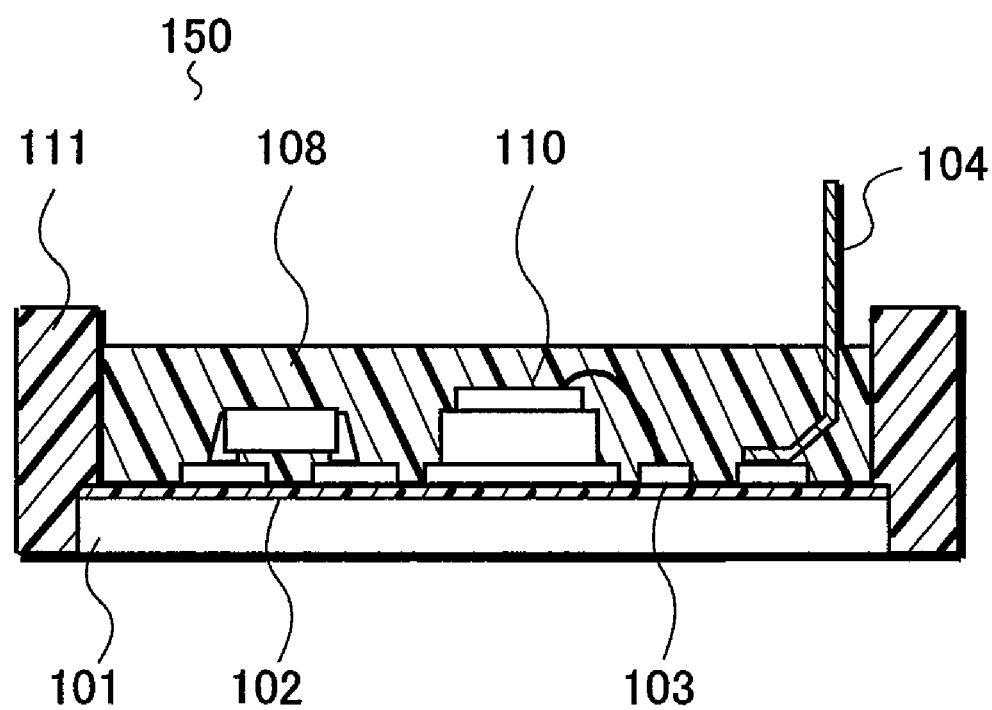
FIG. 10 is a cross sectional view showing a hybrid integrated circuit device described in the background of the invention.

The configuration of another form of the hybrid integrated circuit device 10 is described with reference to FIGS. 9A and 9B. FIG. 9A is a cross sectional view of the hybrid integrated circuit device 10, and FIG. 9B is a plan view of the hybrid integrated circuit device 10 when viewed from below. The basic configuration of the device shown in FIGS. 9A and 9B is the same as the one described above, and the difference lies in that the communicating openings 15, 19 are provided in the lower surface as well as the side surface of the case member 12.

As shown in FIG. 9A, the first circuit board 18, in which a power transistor is arranged, is formed smaller than the second circuit board 20, in which controlling elements such as a microcomputer are arranged. The case member 12 has such a size large enough to house a larger second circuit board 20, and therefore, if the first circuit board 18 is arranged in the center portion of the case member 12, then a free space is produced in the periphery of the first circuit board 18. Here, the communicating opening 15 is provided in the bottom of the case member 12 in the periphery of the first circuit board 18. With this configuration, the air having high temperature in the hollow portion 26 inside the device is released to the outside through the communicating opening 15. At the same time, unheated air is admitted into the hollow portion 26 through the communicating opening 15. Furthermore, a communicating opening 19 is provided by partially opening a side wall part of the case member 12, and has the same function as that of the communicating opening 15.

As shown in FIG. 9B, in the case member 12, a supporting part 23 is provided in a grid pattern, so as to support the first circuit board 18 near the center portion of the case member 12. In the rear surface of the case member 12, the communicating opening 15 is provided in the periphery of the first circuit board 18.

Furthermore, as shown in FIG. 9A, an output signal from the switching circuit formed on the upper surface of the first circuit element 22 may be outputted to the outside via both of the lead fixedly secured to the upper surface of the first circuit board 18 and the lead fixedly secured to the second circuit board 20. Furthermore, a high current of the source power or the like may be inputted to the inside of the device via both of the leads. Specifically, the lead 28B is fixedly secured to the upper surface of the first circuit board 18, and is connected to the first circuit element 22 constituting the switching circuit. The upper end of the lead 28B penetrates the second circuit board 20 and is connected to a conductive pattern formed on the upper surface of the second circuit board 20. Additionally, the upper end part of the lead 28B is not led to the outside.

A lead 25 that is formed thicker than the lead 28B is fixedly secured to the upper surface of the second circuit board 20, and the lead 25 is connected to the lead 28B via the conductive pattern formed on the upper surface of the second circuit board 20. This configuration allows an output from the first circuit element 22 to be taken out to the outside via the lead 28B and the lead 26, the first circuit element 22 being formed on the upper surface of the first circuit board 18.

Additionally, a small signal, such as a control signal or an input to a sensor, may be inputted and outputted through a plug-in type connector mounted on the upper surface of the second circuit board 20.

Furthermore, in the method of manufacturing a hybrid integrated circuit shown in FIG. 9, the sealing resin can be injected to the inside of the case member 12 through the communicating openings 15, 19 provided in the case member 12. The sealing resin injected into the hollow portion 26 of the case member 12 is injected to an extent that the second circuit element 24 mounted on the lower surface of the second circuit board 20 is covered. Additionally, the sealing resin may be injected so as to completely fill the hollow portion 26, or the sealing resin may be formed so as to leave the hollow portion 26 not being filled completely. Furthermore, when the sealing resin is injected to the inside of the case member 12 from the communicating openings 15, 19, the case member 12 is placed upside down with respect to the one shown in FIG. 9A.

According to the present invention, the opening for allowing a sealing resin to be injected into the internal space of the case is provided by opening the case member. Since this eliminates a need to provide, in the first circuit board and the second circuit board which are to be fitted in the case, an opening for allowing a resin to be injected. Accordingly an opening for allowing a resin to be injected can be formed without reducing the packaging density of these substrates.

Furthermore, according to the present invention, the inner wall of the case member facing the opening has an inclined surface. This allows a liquid sealing resin, which is injected from above into the opening of the case member, to be smoothly filled in the internal space of the case member along the inclined surface.

What is claimed is:

1. A circuit device, comprising: a case member; a first circuit board fitted into a bottom portion of the case member; a second circuit board fitted into the case member so as to define an internal space between the first and second circuit boards;
   a first circuit element fixed to a principal surface of the first circuit board; and a second circuit element fixed to a principal surface of the second circuit board, wherein an opening is formed in the bottom portion of the case member and surrounds a side surface of the first circuit board, the opening comprising a plurality of openings, each of which is connected to the internal space of the case member so that the internal space and the opening in the bottom portion together form a conduit for air flow and the bottom portion of the case member further comprises a center opening, the first circuit board is fitted into the center opening of the case member, and the plurality of openings surrounds the center opening; and
   a sealing resin covering at least the principal surface of the first circuit board and the first circuit element and covering at least the principal surface of the second circuit board and the second circuit element.

2. The circuit device according to claim 1, wherein a side wall of the case member facing the opening has an inclined surface.

3. The circuit device according to claim 1, wherein the internal space comprises a hollow portion which is not filled with the sealing resin.

4. The circuit device according to claim 1, wherein a sidewall of the case member has an opening connected to the internal space of the case member.

* * * * *